(12) United States Patent
Fan et al.

(10) Patent No.: US 12,225,723 B2
(45) Date of Patent: Feb. 11, 2025

(54) NON-VOLATILE MEMORY DEVICE

(71) Applicant: IOTMEMORY TECHNOLOGY INC., Taipei (TW)

(72) Inventors: Der-Tsyr Fan, Taoyuan (TW); I-Hsin Huang, Taoyuan (TW); Tzung-Wen Cheng, New Taipei (TW)

(73) Assignee: IOTMEMORY TECHNOLOGY INC., Taipei (TW)

( * ) Notice: Subject to any disclaimer, the term of this patent is extended or adjusted under 35 U.S.C. 154(b) by 306 days.

(21) Appl. No.: 17/709,370

(22) Filed: Mar. 30, 2022

(65) Prior Publication Data
US 2023/0320088 A1   Oct. 5, 2023

(51) Int. Cl.
*H10B 41/44*   (2023.01)
*H10B 41/10*   (2023.01)
*H10B 41/48*   (2023.01)

(52) U.S. Cl.
CPC ............. *H10B 41/44* (2023.02); *H10B 41/10* (2023.02); *H10B 41/48* (2023.02)

(58) Field of Classification Search
None
See application file for complete search history.

(56) References Cited

U.S. PATENT DOCUMENTS

| | | | |
|---|---|---|---|
| 6,248,631 B1 * | 6/2001 | Huang | H10B 69/00 438/257 |
| 8,530,950 B1 | 9/2013 | Kang | |
| 2003/0162347 A1 | 8/2003 | Wang | |
| 2004/0041202 A1 | 3/2004 | Kim | |
| 2005/0006691 A1 * | 1/2005 | Wu | H01L 29/7885 257/314 |
| 2005/0269624 A1 | 12/2005 | Hu | |
| 2006/0175654 A1 | 8/2006 | Pan | |
| 2006/0205136 A1 | 9/2006 | Tessariol | |
| 2011/0281427 A1 | 11/2011 | Choi | |
| 2013/0313626 A1 | 11/2013 | Huang | |
| 2016/0225777 A1 * | 8/2016 | Cheng | H01L 29/7885 |
| 2016/0336415 A1 | 11/2016 | Wu | |
| 2016/0365350 A1 | 12/2016 | Chuang | |
| 2017/0040334 A1 * | 2/2017 | Cheng | H10B 41/35 |

(Continued)

FOREIGN PATENT DOCUMENTS

CN   204792794 U   * 11/2015
CN   106206588 A   * 12/2016

(Continued)

*Primary Examiner* — Michael Lebentritt
(74) *Attorney, Agent, or Firm* — Winston Hsu

(57) ABSTRACT

A non-volatile memory device includes at least one memory cell, and the at least one memory cell includes a substrate, a stacked structure, a tunneling dielectric layer, a floating gate, a control gate structure, and an erase gate structure. The stacked structure is disposed on the substrate, and includes a gate dielectric layer, an assist gate, and an insulation layer stacked in order. The tunneling dielectric layer is disposed on the substrate at one side of the stacked structure. The floating gate is disposed on the tunneling dielectric layer and includes an uppermost edge and a curved sidewall. The control gate structure covers the curved sidewall of the floating gate. The erase gate structure covers the floating gate and the control gate structure, and the uppermost edge of the floating gate is embedded in the erase gate structure.

20 Claims, 10 Drawing Sheets

(56) References Cited

U.S. PATENT DOCUMENTS

| | | |
|---|---|---|
| 2020/0251480 A1 | 8/2020 | Jang |
| 2021/0358927 A1 | 11/2021 | Wang |
| 2021/0384205 A1 | 12/2021 | Zhang |
| 2022/0293614 A1 | 9/2022 | Cai |
| 2022/0293756 A1 | 9/2022 | Xing |
| 2023/0232623 A1* | 7/2023 | Fan .................. H01L 29/40114 438/257 |

FOREIGN PATENT DOCUMENTS

| | | | | |
|---|---|---|---|---|
| CN | 109216364 A | * | 1/2019 | ......... G11C 16/0408 |
| CN | 111524894 A | | 8/2020 | |
| CN | 111180447 B | * | 4/2023 | ........ H01L 27/11519 |
| DE | 102011053110 B4 | * | 3/2017 | ........ H01L 27/11521 |
| JP | 7-106446 A | | 4/1995 | |
| JP | 10-32270 A | | 2/1998 | |
| JP | 11-111866 A | | 4/1999 | |
| JP | 2001-85543 A | | 3/2001 | |
| JP | 2014-96421 A | | 5/2014 | |
| KR | 19990057075 A | * | 7/1999 | |
| RU | 2 216 821 C2 | | 11/2003 | |
| TW | 200729514 | | 8/2007 | |
| TW | 201508753 A | | 3/2015 | |
| TW | M513458 U | | 12/2015 | |
| TW | 201633319 A | | 9/2016 | |
| TW | 201640621 A | * | 11/2016 | ........ H01L 27/11517 |
| TW | 201644037 A | | 12/2016 | |
| TW | 201839770 A | | 11/2018 | |
| TW | 202018917 A | | 5/2020 | |
| TW | 202236627 A | | 9/2022 | |
| WO | 2020/179199 A1 | | 9/2020 | |
| WO | 2022/191864 A1 | | 9/2022 | |

* cited by examiner

NON-VOLATILE MEMORY DEVICE

BACKGROUND OF THE INVENTION

1. Field of the Invention

The invention relates to a semiconductor device. More particularly, the invention relates to a non-volatile memory device.

2. Description of the Prior Art

Since a non-volatile memory can, for instance, repeatedly perform operations such as storing, reading, and erasing data, and since stored data is not lost after the non-volatile memory is shut down, the non-volatile memory has been extensively applied in personal computers and electronic equipment.

A conventional structure of non-volatile memory has a stack-gate structure, including a tunneling oxide layer, a floating gate, a coupling dielectric layer, and a control gate disposed on a substrate in order. When a programming or erasing operation is performed on such a flash memory device, a suitable voltage is respectively applied to the source region, the drain region, and the control gate, such that electrons are injected into a floating gate, or electrons are pulled out from the floating gate.

In the programming and erasing operation of the non-volatile memory, a greater gate-coupling ratio (GCR) between the floating gate and the control gate generally means a lower operating voltage is needed for the operation, and the operating speed and the efficiency of the flash memory are significantly increased as a result. However, during programming or erase operations, electrons have to be injected into or pulled out of the floating gate through a tunneling oxide layer disposed under the floating gate, which often causes damages to the structure of the tunneling oxide layer and thus reduces the reliability of the memory device.

In order to increase the reliability of the memory device, an erase gate is adopted and incorporated into to the memory device, which is capable of pulling the electrons from the floating gate by applying a positive voltage to the erase gate. Thus, since the electrons in the floating gate is pulled out through a tunneling oxide layer disposed on the floating gate rather than through the tunneling oxide layer disposed under the floating gate, the reliability of the memory device is further improved.

With an increasing demand for high-efficient memory device, there is still a need to provide an improved memory device which is capable of erasing the stored data efficiently.

SUMMARY OF THE INVENTION

The invention provides a non-volatile memory device which is capable of erasing the stored data efficiently and in a low erasing voltage.

According to some embodiments of the present disclosure, a non-volatile memory device is disclosed. The non-volatile memory device includes at least one memory cell, and the at least one memory cell includes a substrate, a stacked structure, a tunneling dielectric layer, a floating gate, a control gate structure, and an erase gate structure. The stacked structure is disposed on the substrate, and includes a gate dielectric layer, an assist gate, and an insulation layer stacked in order. The tunneling dielectric layer is disposed on the substrate at one side of the stacked structure. The floating gate is disposed on the tunneling dielectric layer and includes an uppermost edge and a curved sidewall. The control gate structure covers the curved sidewall of the floating gate. The erase gate structure covers the floating gate and the control gate structure, and the uppermost edge of the floating gate is embedded in the erase gate structure.

By using the non-volatile memory device according to the embodiments of the present disclosure, the erase voltage applied to the device can be reduced, which means that electrons can be effectively pulled out of the floating gate, and as a result the speed of erasing data is increased. Besides, since the erase gate is allowed to cover both the floating gate and the control gate structure, the erase gate can have an increased width and thus can be manufactured more easily.

In order to make the aforementioned features and advantages of the disclosure more comprehensible, embodiments accompanied with figures are described in detail below.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
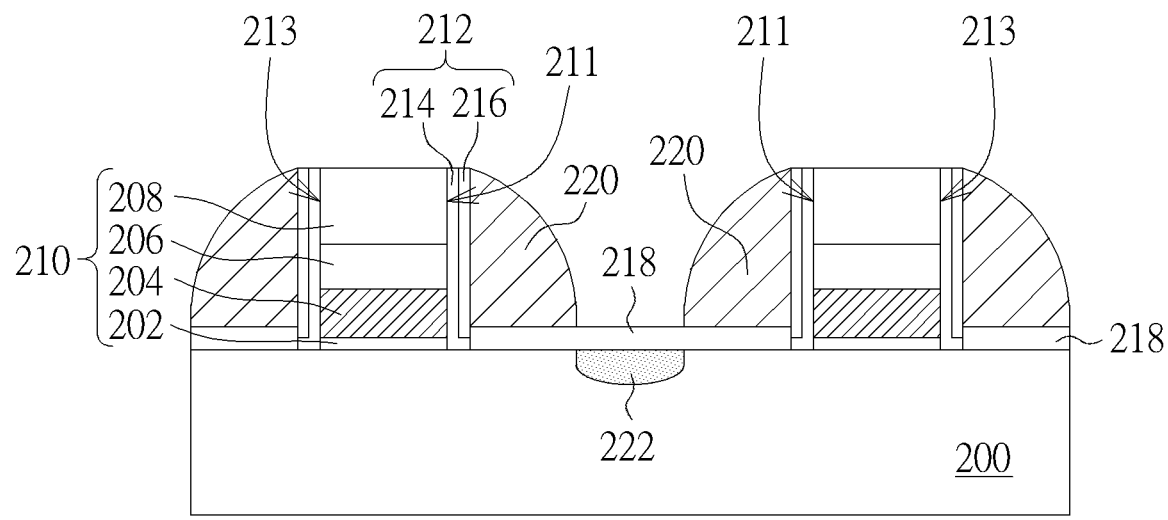
FIG. 1 is a schematic cross-sectional view illustrating a structure including stacked structures and conductive spacers at a stage of a method for fabricating a non-volatile memory device according to some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "under", "on", "over", "above", "upper", "bottom", "top" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "under" other elements or features would then be oriented "above" and/or "over" the other elements or features. The apparatus may be otherwise oriented (rotated 90 degrees or at other orientations) and the spatially relative descriptors used herein may likewise be interpreted accordingly.

Although the disclosure is described with respect to specific embodiments, the principles of the disclosure, as defined by the claims appended herein, may obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

FIG. 1 is a schematic cross-sectional view illustrating a structure including stacked structures and conductive spacers at a stage of a method for fabricating a non-volatile memory device according to some embodiments of the present disclosure. Referring to FIG. 1, a structure formed at this manufacturing stage includes at least a substrate 200, at least one stacked structure 210, an isolation material layer 212, a tunneling dielectric layer 218, a conductive spacer 220, and a source region 222.

According to some embodiments of the present disclosure, the substrate 200 may be a semiconductor substrate with suitable conductivity type, such as p-type or n-type. The composition of the substrate 200 may include silicon, germanium, gallium nitride or other suitable semiconductor materials, but not limited thereto.

At least one stacked structure 210 is on the substrate 200. For example, two stacked structures 210 are disposed on the substrate 200 and laterally spaced apart from each other. Each of the stacked structures 210 includes a gate dielectric layer 202, an assist gate 204, an insulation layer 206, and a sacrificial layer 208 stacked in order. Each of the stacked structures 210 include a first sidewall 211 and a second sidewall 211, and the first sidewalls 211 of the stacked structures 210 faces toward each other. The assist gate 204 is made of conductive material, and the assist gate 204 is configured to turn on/off of a carrier channel in the substrate 200 underlying the assist gate 204 when applied with a suitable voltage. The insulation layer 206 is made of insulating material, such as silicon oxide, silicon oxide, or silicon oxynitride, but not limited thereto, which is used to electrically isolate the assist gate 204 from layers disposed above the assist gate 204. The sacrificial layer 208 is an uppermost layer in the stacked structure 210, which is a temporary layer configured to be removed before the subsequent process of forming a gate structure, such as an upper gate structure, on the assist gate 204.

The isolation material layer 212 is formed on the sidewalls 211, 213 of the stacked structures 210. The material of the isolation material layer 212 is, for instance, silicon oxide/silicon nitride/silicon oxide or silicon nitride/silicon oxide. The forming method of the isolation material layer 212 includes, for instance, first forming a dielectric layer 214 and a dielectric layer 216 covering each of the stacked structures 210 on the substrate 200 in order, and then removing a portion of the dielectric layer 214 and the dielectric layer 216 to form the isolation material layer 212 on the sidewall of each of the stacked structures 210. The material of the dielectric layer 214 is, for instance, silicon nitride, and the material of the dielectric layer 216 is, for instance, silicon oxide. The forming method of the dielectric layer 214 and the dielectric layer 216 is, for instance, a chemical vapor deposition method. The method of removing a portion of the dielectric layer 214 and the dielectric layer 216 is, for instance, an anisotropic etching method.

The tunneling dielectric layer 218 is formed on the substrate 200 at least between the stacked structures 210 or further at both sides of the stacked structures 210. The material of the tunneling dielectric layer 218 is, for instance, silicon oxide, or other layers that allow hot electrons pass through it by tunneling effect. The forming method of the tunneling dielectric layer 218 is, for instance, a thermal oxidation or deposition method, but not limited thereto.

The conductive spacer 220 is formed on the sidewall 211, 213 of each of the stacked structures 210. The method of forming the conductive spacer 220 may include the following steps. First, a conductive layer (not shown) is formed on the substrate 200. The material of the conductive layer is, for instance, doped polysilicon, polycide or other suitable conductive material. When the material of the conductive layer is doped polysilicon, its forming method includes, for instance, performing an ion implantation step after an undoped polysilicon layer is formed via a chemical vapor deposition method; or performing a chemical vapor deposition method with an in-situ dopant implantation method.

Then, an etching process, such as an anisotropic etching process or an etch-back process, is performed to etch the conductive layer. As a result, a portion of the tunneling dielectric layer 218 between the stacked structures 210 is exposed and the conductive spacer 220 is formed.

Afterwards, a source region 222 is formed in the substrate 200 between the conductive spacers 220 disposed on the first sidewalls 211 of the stacked structures 210. The method of forming the source region 222 includes, for instance, performing an ion implantation process by using the conductive spacers 220 as a mask. The implanted dopant can be an n-type or p-type dopant as decided according to the requirements of the device. The source region 222 may be regarded as a shared source region since the source region 222 is shared by two adjacent memory cells each including at least the stacked structure 210 and the conductive spacer 220.

Figure 2:
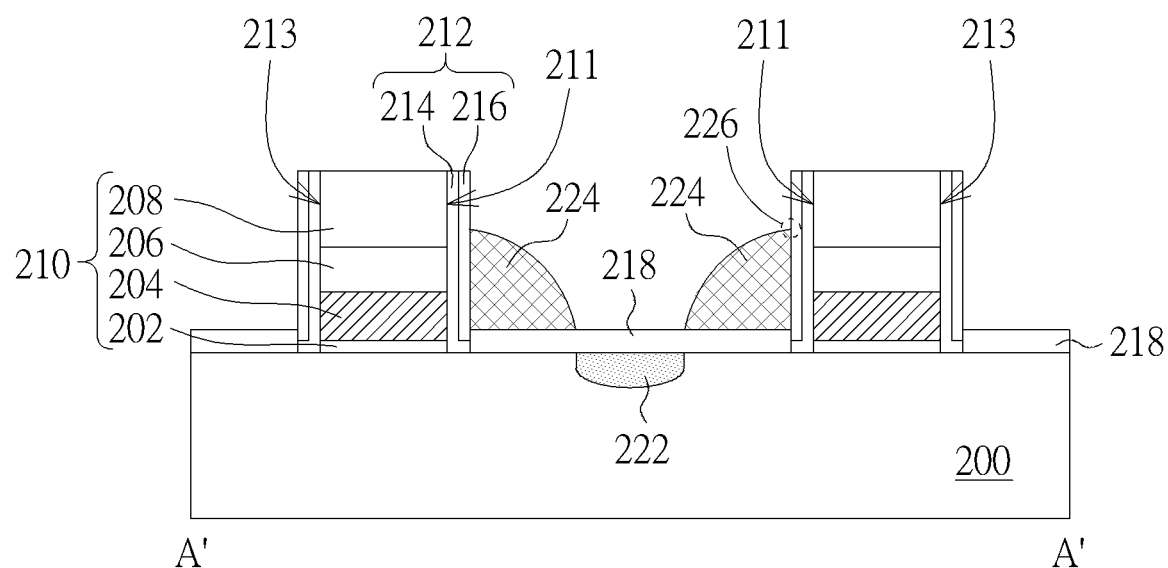
FIG. 2 is a schematic cross-sectional view illustrating a structure including floating gates on the sidewalls of stacked structures at a stage of a method for fabricating a non-volatile memory device according to some embodiments of the present disclosure.

FIG. 2 is a schematic cross-sectional view illustrating a structure including floating gates on the sidewalls of stacked structures at a stage of a method for fabricating a non-volatile memory device according to some embodiments of the present disclosure. Referring to FIG. 2, the conductive spacer 220 is patterned and/or trimmed to form a floating gate 224. The method of patterning the conductive spacer 220 is as follows. A patterned photoresist layer (not shown) is formed on the substrate 200 to cover portions of the conductive spacer 220. Then, the conductive spacer 220 exposed from the patterned photoresist layer is removed completely so that only the conductive spacer 220 disposed on the first sidewall 211 of the stacked structure 210 remain. Besides, portions of the conductive spacer 220 disposed on the first sidewall 211 of the stacked structure 210 can be patterned to have a polygonal contour when viewed from a top-down perspective. Then, the patterned photoresist layer is removed. The height of the floating gate 224 can be properly controlled by performing a trimming process. According to some embodiments of the present disclosure, an uppermost edge 226 of the floating gate 224 is higher than a top surface of the assist gate 204, and higher than or slightly lower than the bottom surface of the sacrificial layer 208. A schematic top view corresponding to the structure shown in FIG. 2 is shown in FIG. 3.

Figure 3:
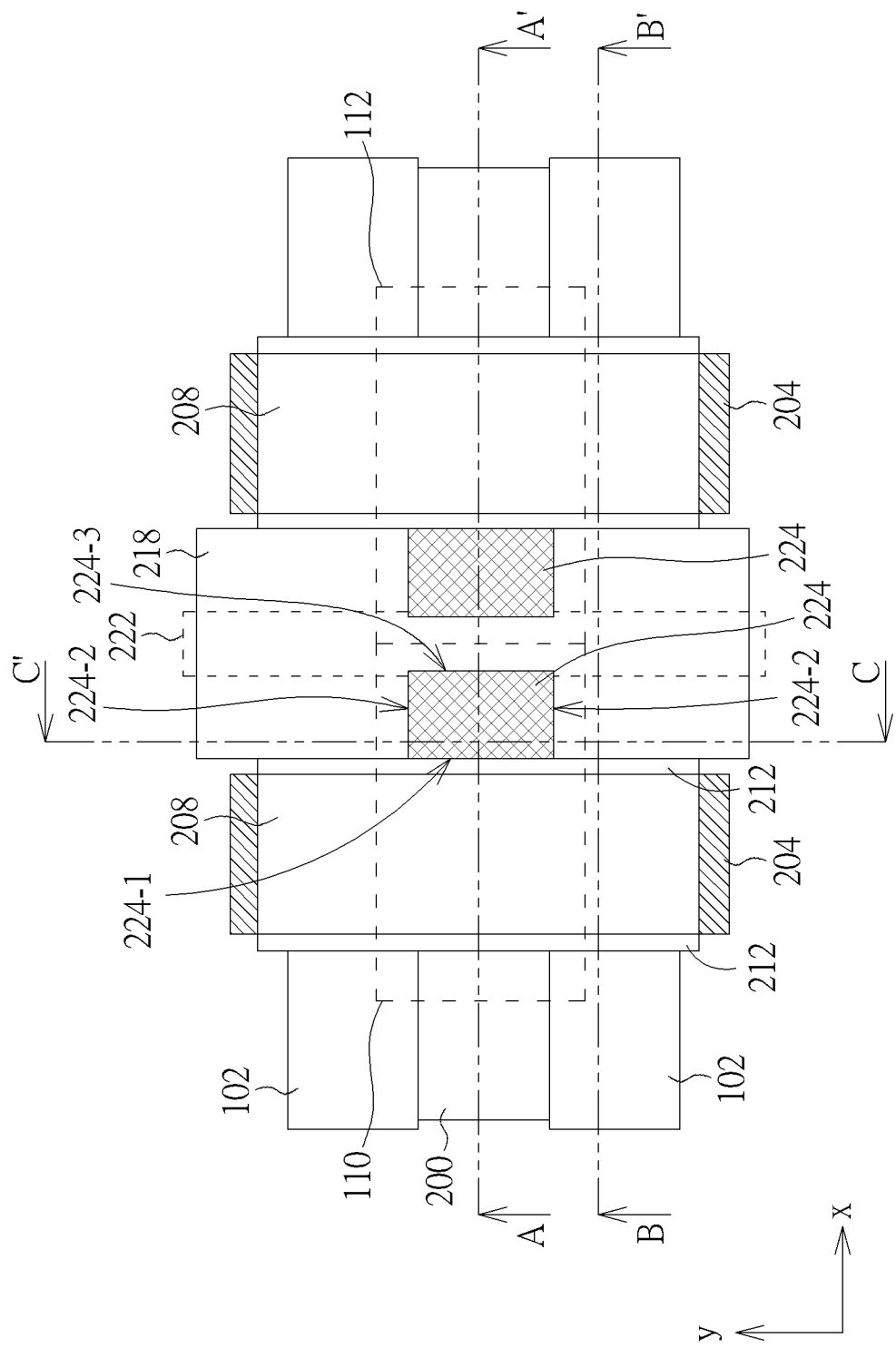
FIG. 3 is a schematic top view illustrating a structure including floating gates on the sidewalls of stacked structures at a stage of a method for fabricating a non-volatile memory device according to some embodiments of the present disclosure.

FIG. 3 is a schematic top view illustrating a structure including floating gates on the sidewalls of stacked structures at a stage of a method for fabricating a non-volatile memory device according to some embodiments of the present disclosure. FIG. 2 may correspond to a cross-sectional view taken along line A-A' in FIG. 3. Referring to FIG. 3, the substrate 200 between the isolation structures 102, such as shallow trench isolation structures, can act as an active region of a memory device, and the active region can extend in a first direction, such as an x-direction. The assist gate 204 and the sacrificial layer 208, both of which are components of the stacked structure 210, and the source region 222 can extend in a second direction, such as a y-direction, perpendicular to the first direction. At least one floating gate, such as two floating gates 224, is disposed between two adjacent assist gates 204. Each of the floating gates 224 includes an inner sidewall 224-1 facing toward a sidewall of the isolation material layer 212, a lateral sidewall 224-2, and a curved sidewall 224-3 connected to the edges of the inner sidewall 224-1 and the lateral sidewall 224-2. According to some embodiments of the present disclosure, the top view of the FIG. 3 include at least two memory cell regions, such as a first memory cell region 110 and a second memory cell region 112. The first and second memory cell regions 110, 112 can be used to accommodate memory cells respectively, and the two memory cells can be mirror symmetric to each other.

Figure 4:
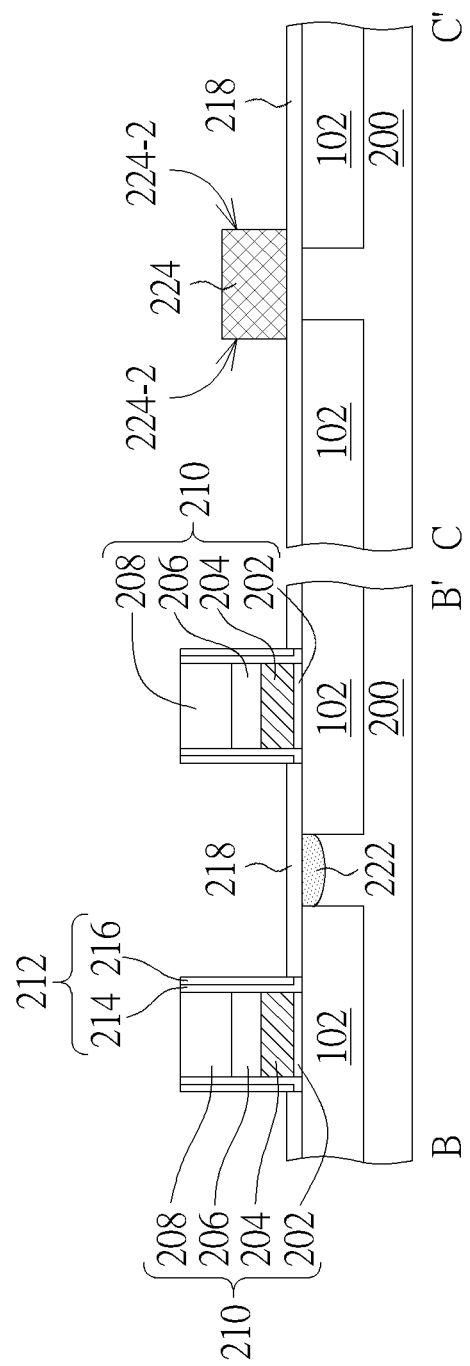
FIG. 4 is a schematic cross-sectional view taken along line B-B' and line C-C' of FIG. 3 at a stage of a method for fabricating a non-volatile memory device according to some embodiments of the present disclosure.

FIG. 4 is a schematic cross-sectional view taken along line B-B' and line C-C' of FIG. 3 at a stage of a method for fabricating a non-volatile memory device according to some embodiments of the present disclosure. The views BB' and CC' of FIG. 4 and the view AA' of FIG. 2 are at the same manufacturing stage. Referring to view BB' of FIG. 4, the isolation structures 102 are disposed under the stacked structures 210 respectively, and the source region 222 is defined between two adjacent isolation structures 102. Referring to view CC' of FIG. 4, the isolation structures 102 are disposed at two sides of the floating gate 224, and the active region (not shown) may be defined in the substrate 200 between two adjacent isolation structures 102.

Figure 5:
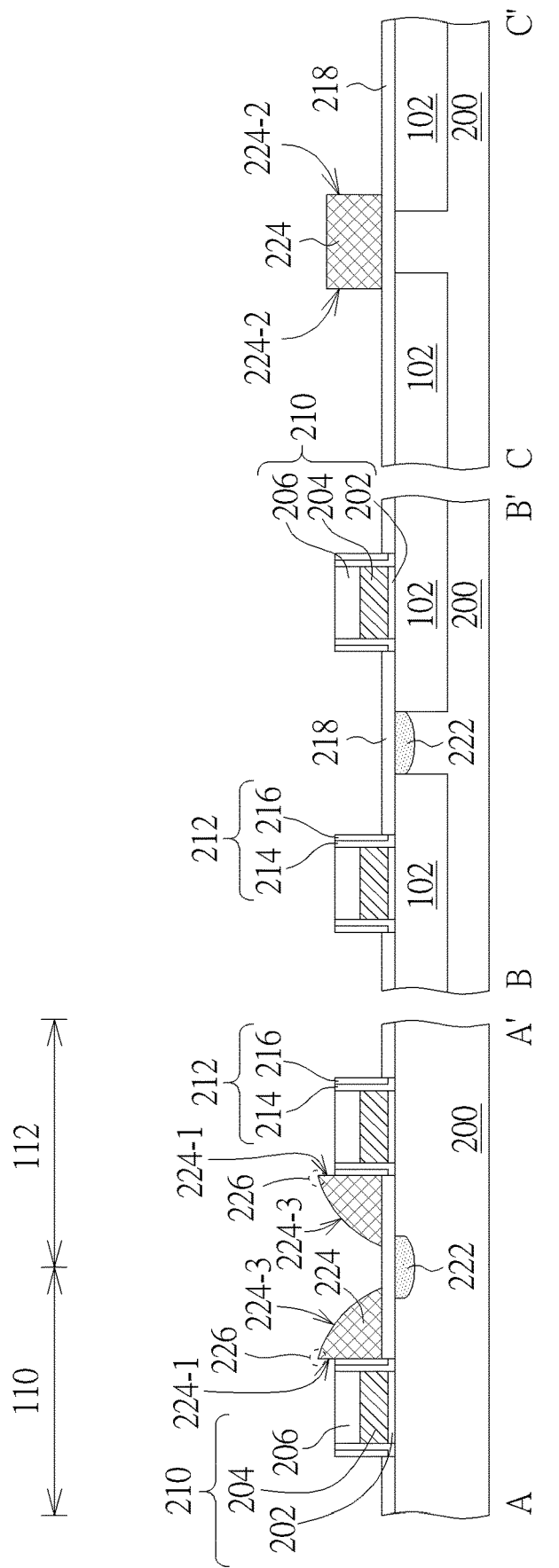
FIG. 5 is a schematic cross-sectional view taken along line A-A', line B-B' and line C-C' of FIG. 3 at a manufacturing stage subsequent to FIG. 4 according to some embodiments of the present disclosure, where an uppermost edge of a floating gate is higher than a top surface of a stacked structure.

FIG. 5 is a schematic cross-sectional view taken along line A-A', line B-B' and line C-C' of FIG. 3 at a manufacturing stage subsequent to FIG. 4 according to some embodiments of the present disclosure, where an uppermost edge of a floating gate is higher than a top surface of a stacked structure. Referring to FIG. 5, especially the view AA' of FIG. 5, the sacrificial layer 208 in each stacked structure 210 is removed completely until a top surface of the insulation layer 206 is exposed. During removing the sacrificial layer 208, a portion of the insulation layer 206 may be removed slightly. Besides, a portion of the isolation material layer 212 disposed between the stacked structure 210 and the floating gate 224 can be removed. The method of removing the sacrificial layer 208 and a portion of the insulation layer 206 is, for instance, a wet etching method or a dry etching method, but not limited thereto. By applying the abovementioned etching process, the uppermost edge 226 of the floating gate 224 is higher than the top surface of the insulation layer 206, and a portion of the inner sidewall 224-1 of the floating gate 224 can be exposed.

Figure 6:
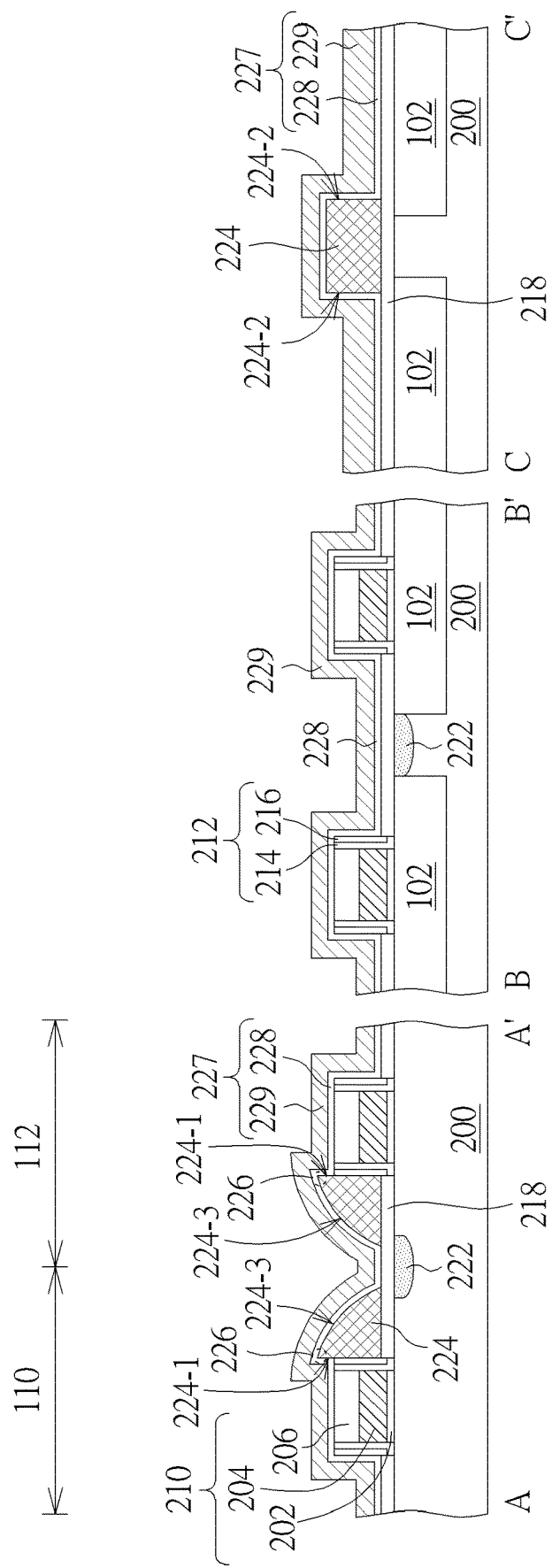
FIG. 6 is a schematic cross-sectional view taken along line A-A', line B-B' and line C-C' of FIG. 3 at a manufacturing stage subsequent to FIG. 5 according to some embodiments of the present disclosure, where an uppermost edge of a floating gate is covered with a stacked layer.

FIG. 6 is a schematic cross-sectional view taken along line A-A', line B-B' and line C-C' of FIG. 3 at a manufacturing stage subsequent to FIG. 5 according to some embodiments of the present disclosure, where an uppermost edge of a floating gate is covered with a stacked layer. Referring to FIG. 6, a stacked layer 227 including a dielectric layer 228 and a conductive layer 229 is formed on the substrate 200, the stacked structure 210, and the tunneling dielectric layer 218. Thus, the inner sidewall 224-1, the lateral sidewall 224-2, and the curved sidewall 224-3 of the floating gate 224 can be covered with the stacked layer 227. Referring to view AA' of FIG. 6, a portion of the inner sidewall 224-1 of the floating gate 224 is in direct contact with the dielectric layer 228. According to some embodiments of the present disclosure, the stacked layer 227 is a conformal layer that conforms to the shapes of the layers under the dielectric layer 228. The dielectric layer 228 can be a single-layered or multi-layered structure, and the material of the dielectric layer 228 is, for instance, silicon oxide, silicon nitride/silicon oxide, other high-dielectric constant materials (k>4), or other insulating material. For example, the dielectric layer 228 can be a three layer structure including silicon oxide/silicon nitride/silicon oxide stacked in sequence. The forming method thereof is, for instance, a chemical vapor deposition method or other blanket deposition methods, but not limited thereto. The material of the conductive layer 229 can be, for instance, doped polysilicon or polycide. The forming method thereof is, for instance, a chemical vapor deposition method or other blanket deposition methods, but not limited thereto.

Figure 7:
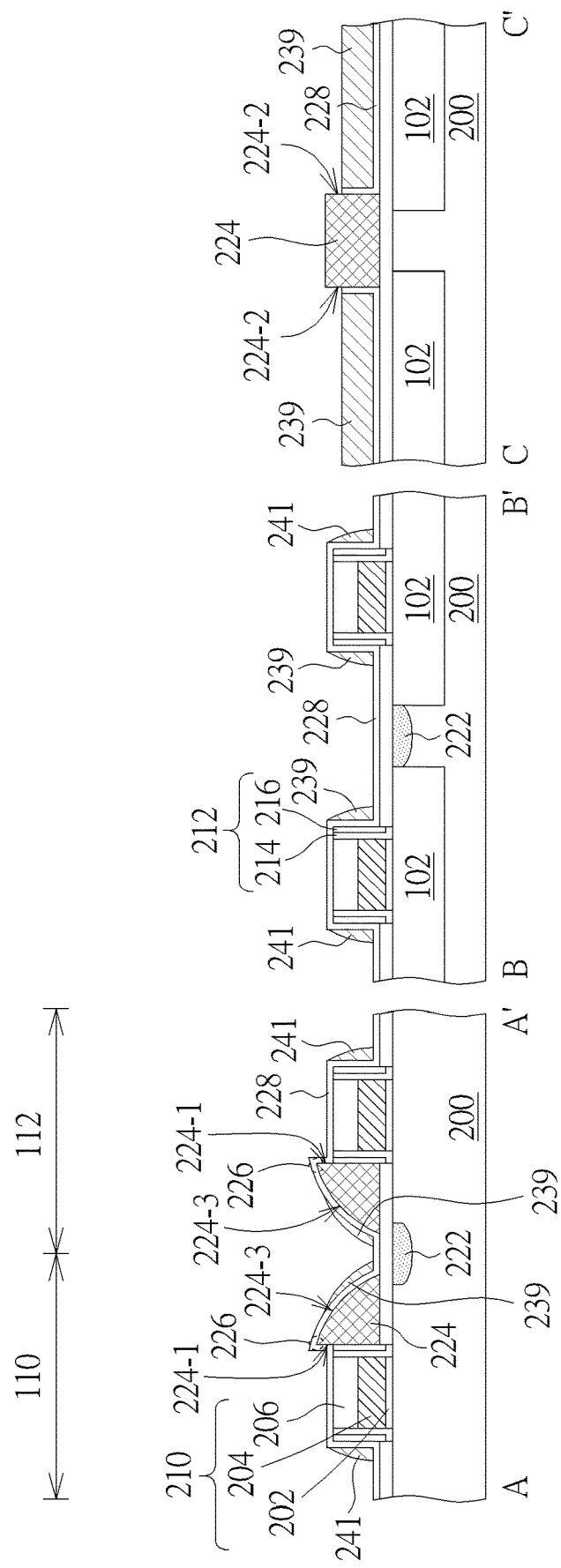
FIG. 7 is a schematic cross-sectional view taken along line A-A', line B-B' and line C-C' of FIG. 3 at a manufacturing stage subsequent to FIG. 6 according to some embodiments of the present disclosure, where a control gate is formed on a curved sidewall of a floating gate.

FIG. 7 is a schematic cross-sectional view taken along line A-A', line B-B' and line C-C' of FIG. 3 at a manufacturing stage subsequent to FIG. 6 according to some embodiments of the present disclosure, where a control gate is formed on a curved sidewall of a floating gate. Referring to view AA' of FIG. 7, the conductive layer 229 disposed on the dielectric layer 228 is patterned to form at least one control gate 239 and a residual conductive layer 241 at two opposite sides of the stacked structure 210 respectively. In specific, the control gate 239 and the residual conductive layer 241 are spacer-shaped structures with curved outer sidewalls. Besides, the control gates 239 can be formed in the first memory cell region 110 and the second memory cell region 112 respectively, and each of the control gates 239 can cover the curved sidewall 224-3 of the corresponding floating gate 224. The control gate 239 includes an uppermost edge which is lower than the uppermost edge 226 of the floating gate 224. Also, referring to view CC' of FIG. 7, the dielectric layer 228 and the control gate 239 can be disposed on the lateral sidewall 224-2 of the floating gate 224 and can extend across the underlying isolation structure 102. During the process of forming the control gate 239, the stacked structure 210 and the floating gate 224 are covered with the dielectric layer 228. Thus, the dielectric layer 228 can be used as a protective layer to protect the surfaces of the stacked structure 210 and the floating gate 224 from damages caused by the etching process.

Figure 8:
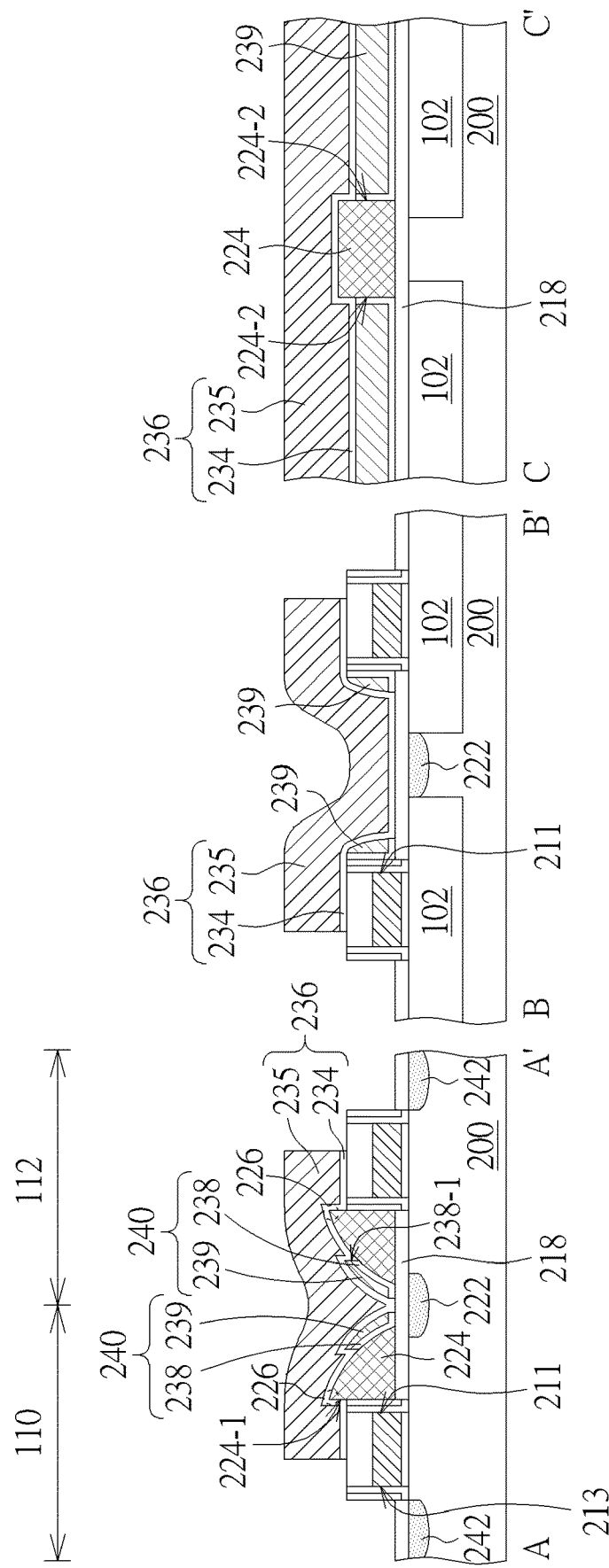
FIG. 8 is a schematic cross-sectional view of a non-volatile memory device corresponding to line A-A', line B-B' and line C-C' of FIG. 3 according to some embodiments of the present disclosure, where an erase gate covers a floating gate and a control gate.

After the manufacturing stage shown in FIG. 7, the dielectric layer 228 exposed from the control gate 239 can be further stripped using the control gate 239 as an etch hardmask, and then an erase gate structure 236 can be formed on the floating gate 224 and a control gate structure 240. The corresponding structure is illustrated in FIG. 8 as an example. FIG. 8 is a schematic cross-sectional view of a non-volatile memory device corresponding to line A-A', line B-B' and line C-C' of FIG. 3 according to some embodiments of the present disclosure, where an erase gate covers a floating gate and a control gate. Referring to view AA' of FIG. 8, a coupling dielectric layer 238 is disposed between the floating gate 224 and the control gate 239, which is formed by stripping the dielectric layer 228 covering the stacked structure 210 and the floating gate 224 by using the control gate 239 as an etch hardmask. The uppermost edge 238-1 of the coupling dielectric layer 238 is laterally spaced apart from the uppermost edge 226 of the floating gate 224. In this way, the uppermost edge 226 of the floating gate 224 is not covered with the coupling dielectric layer 238. The coupling dielectric layer 238 and the control gate 239 can constitute the control gate structure 240 of a non-volatile memory device.

After the formation of the coupling dielectric layer 238, at least one drain region, such as two drain regions 242, may be formed at sides of the stacked structures 210. The drain regions 242 are disposed in the first memory cell region 110 and the second memory cell region 112 respectively, which can be electrically coupled to each other through vias or contacts in the subsequent manufacturing processes. The forming method of the drain region 242 includes, for instance, performing an ion implantation process. The implanted dopant can be an n-type or p-type dopant as decided according to the design of the device. The dopants and the doping concentrations of the source region 222 and the drain region 242 can be the same and can also be different.

After the formation of the drain region 242, referring to view AA' of FIG. 8, an erase gate structure 236 is formed on the floating gate 224 and the control gate structure 240. The erase gate structures 236 can be a stacked structure including an erase gate dielectric layer 234 and an erase gate 235 stacked in sequence. The erase gate structure 236 can cover the outer surface of the floating gate 224 and the outer surface of the control gate 239. Besides, the erase gate structure 236 can be a continuous layer extending from the first memory cell region 110 to the second memory cell region 112, and fills up the gap between the first memory cell region 110 and the second memory cell region 112 (such as a gap between the two adjacent floating gates 224). Therefore, the erase gate structure 236 can cover at least two floating gates 224 and two control gate structures 240. Furthermore, the inner sidewall 224-1 of the floating gate 224 can be in direct contact with the erase gate structure 236, and the uppermost edge 226 of the floating gate 224 can be embedded in the erase gate structure 236. Since the width of the erase gate structure 236 is larger than the sum of the bottom widths of the two floating gates 224 and the two control gates 239, the erase gate structure 236 can be manufactured more easily even if the sizes of the memory cells are small.

The material of the erase gate dielectric layer 234 is, for instance, silicon oxide or silicon oxynitride. The forming method of the erase gate dielectric layer 234 is, for instance, a chemical vapor deposition method. The forming method of the erase gate 235 is as follows: a conductive layer (not shown) is formed on the substrate 200, and then the conductive layer is patterned. The material of the conductive layer is, for instance, doped polysilicon or polycide. When the material of the conductive layer is doped polysilicon, the forming method thereof includes, for instance, performing an ion implantation step after an undoped polysilicon layer is formed via a chemical vapor deposition method; or performing a chemical vapor deposition method with an in-situ dopant implantation method. The method of patterning the conductive layer includes, for instance, a photolithography process and an etching process.

Referring to view BB' of FIG. 8, the control gate 239 and the erase gate 236 can be disposed on the isolation structure 102. Thus, the control gate 239 can be disposed between the erase gate 236 and the isolation structure 102.

Referring to view CC' of FIG. 8, an upper portion of the lateral sidewall 224-2 of the floating gate 224 can be covered with the erase gate structure 236, and an lower portion of the lateral sidewall 224-2 of the floating gate 224 can be covered with the control gate 239. Because of the existence of the control gate 239, a bottom surface of the erase gate structure 236 extending beyond the lateral sidewall 224-2 of the floating gate 224 is spaced apart from the isolation structure 102 and the tunneling dielectric layer 218.

According to some embodiments of the present disclosure, other components, such as vias, bit lines, interlayer dielectric, etc, can be further formed on the substrate 200, and the structure shown in FIG. 8 can be further modified. As a result, the non-volatile memory cell including the structure illustrated in FIG. 8 can be obtained. According to some embodiments of the present disclosure, the non-volatile memory cell includes four gate electrodes, such as the assist gate 204, the floating gate 224, the control gate 239, and the erase gate 235. The control gate structure 240 can be disposed between the substrate 200 and the erase gate structure 236. Specifically, the assist gate 204 can act as a word line used to turn on/off the carrier channel under the assist gate 204. The floating gate 224 can be used to store or trap electron and thus determine the states of the memory cell, such as state "1" or state "0". The control gate 239 can make hot electron tunnel from the carrier channel into the floating gate 224 of the selected cell. The erase gate 235 can be used to remove the electron stored in the floating gate 224.

According to the structure shown in FIG. 8, since the erase gate structure 236 can cover the uppermost edges 226 of the two adjacent floating gates 224, the electron stored in the floating gates 224 can tunnel from the uppermost edges 226 of the floating gates 224 into the erase gate structure 236 when an erase voltage is applied to the erase gate structure 236. Thus, the data stored in two adjacent memory cells of the non-volatile memory device can be erased concurrently and efficiently. Moreover, since the control gate structure 240 can be further disposed on the lateral sidewall of the floating gate 224, a bottom surface of the erase gate structure 236 extending beyond the lateral sidewall 224-2 of the floating gate 224 is spaced apart from the tunneling dielectric layer 218. By forming the control gate structure 240 on the lateral sidewall 224-2 of the floating gate 224, the overlapping area between the erase gate structure 236 and the lateral sidewall 224-2 of the floating gate 224 is reduced, which means that the coupling capacitance between the erase gate structure 236 and the floating gate 224 can be reduced accordingly. During an erase operation, since the electron stored in the floating gate 224 mainly tunnel from the uppermost edge 226 of the floating gate 224 into the erase gate structure 236, the reduced overlapping area between the erase gate structure 236 and the lateral sidewall 224-2 of the floating gate 224 can effectively facilitate the erase efficiency and reduce required erase voltage.

According to some embodiments of the present disclosure, a non-volatile memory device is provided, and the structure of the non-volatile memory device may be the same as, similar to or derived from the structure shown in FIG. 8. The non-volatile memory device includes at least one memory cell disposed in a memory cell region 110, 112, and the at least one memory cell 110, 112 includes the substrate 200, the stacked structure 210, the tunneling dielectric layer 218, a floating gate 224, a control gate structure 240, and an erase gate structure 236. The stacked structure 210 is disposed on the substrate 200 and includes the gate dielectric layer 202, the assist gate 204, and the insulation layer 206 stacked in order. The tunneling dielectric layer 218 is disposed on the substrate 200 at one side of the stacked structure 210. The floating gate 224 is disposed on the tunneling dielectric layer 218 and includes an uppermost edge 226 and a curved sidewall 224-3. The control gate structure 240 covers the curved sidewall 224-3 of the floating gate 224. The erase gate structure 236 covers the floating gate 224 and the control gate structure 240, and the uppermost edge 226 of the floating gate 224 is embedded in the erase gate structure 236.

Figure 9:
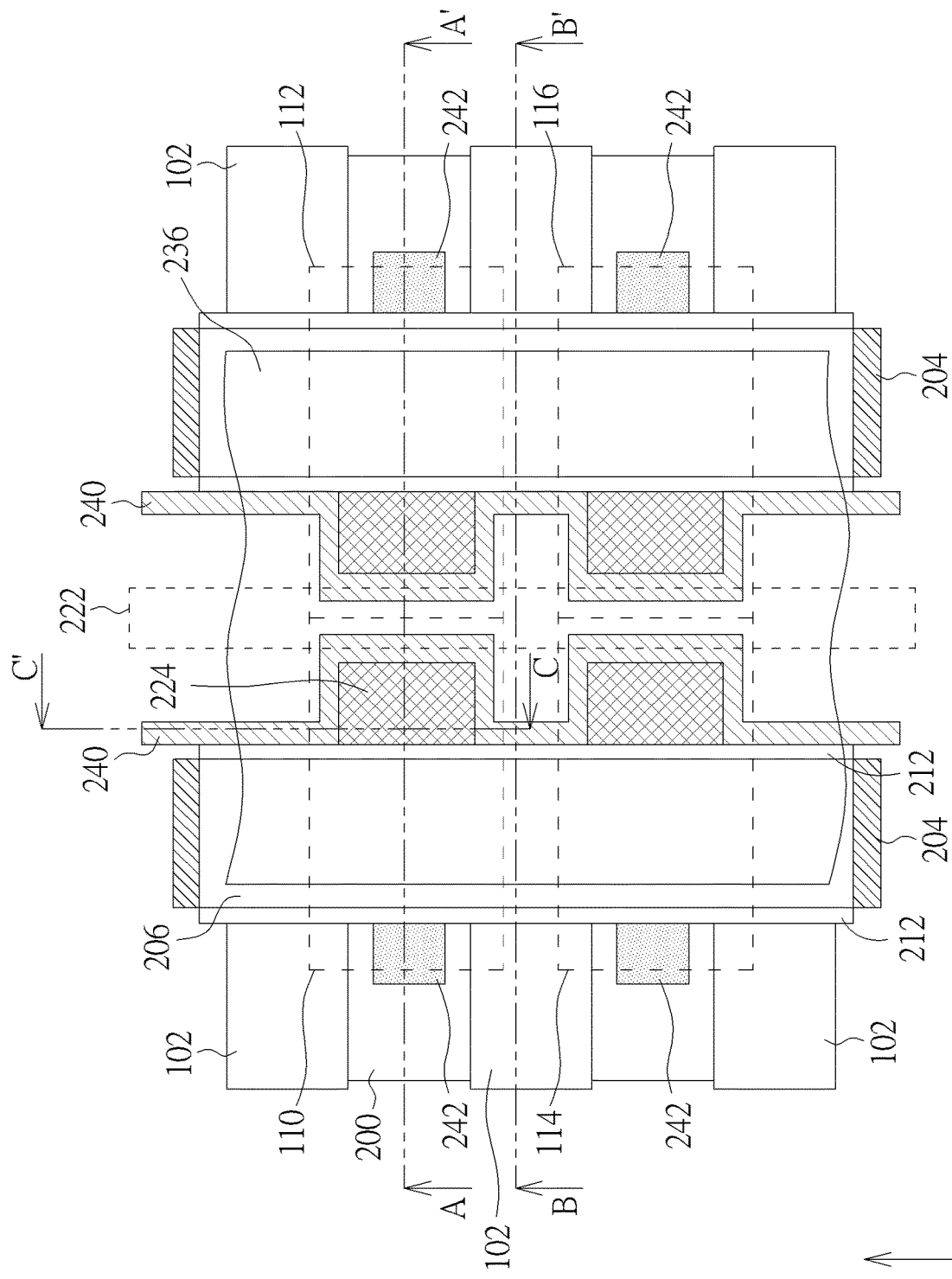
FIG. 9 is a schematic top view of a non-volatile memory device including the structures shown in FIG. 8.

FIG. 9 is a schematic top view of a non-volatile memory device including the structure shown in FIG. 8, where the cross-sectional views taken along lines A-A', B-B' and C-C' of FIG. 9 can correspond to the views AA', BB', and CC' of FIG. 8. Referring to FIG. 9, the non-volatile memory device includes four memory cells accommodated in the first, second, third, and fourth memory regions 110, 112, 114, and 116 respectively. The structures in the first memory region 110 and the second memory region 112 have a mirror image of each other, and the structures in the third memory region 114 and the fourth memory region 116 have a mirror image of each other. The control gate structures 240 can extend along the y-direction, and the number of the control gate structures 240 can be at least two. Thus, one of the control gate structures 240 can extend along the y-direction from the first memory cell region 110 to the third memory cell region 114, and another one of the control gates 239 can extend along the y-direction from the second memory cell region 112 to the fourth cell region 116. Since each control gate structure 240 extend along the y-direction, portions of the control gate structure 240 can cover the floating gates 224, and other portions of the control gate structure 240 can cover the isolation structure 102 disposed between the two adjacent floating gates 224. Regarding the erase gate structure 236, the erase gate structure 236 can extend along the y-direction and cover the underling control gate structures 240 in the first, second, third, and fourth memory cell regions 110, 112, 114, 116. Besides, the gap between two adjacent floating gates 224 can be filled up with the erase gate structure 236.

In the following paragraphs, an alternative embodiment of the present disclosure are further described, and only the main differences between the embodiments are described for the sake of brevity.

Figure 10:
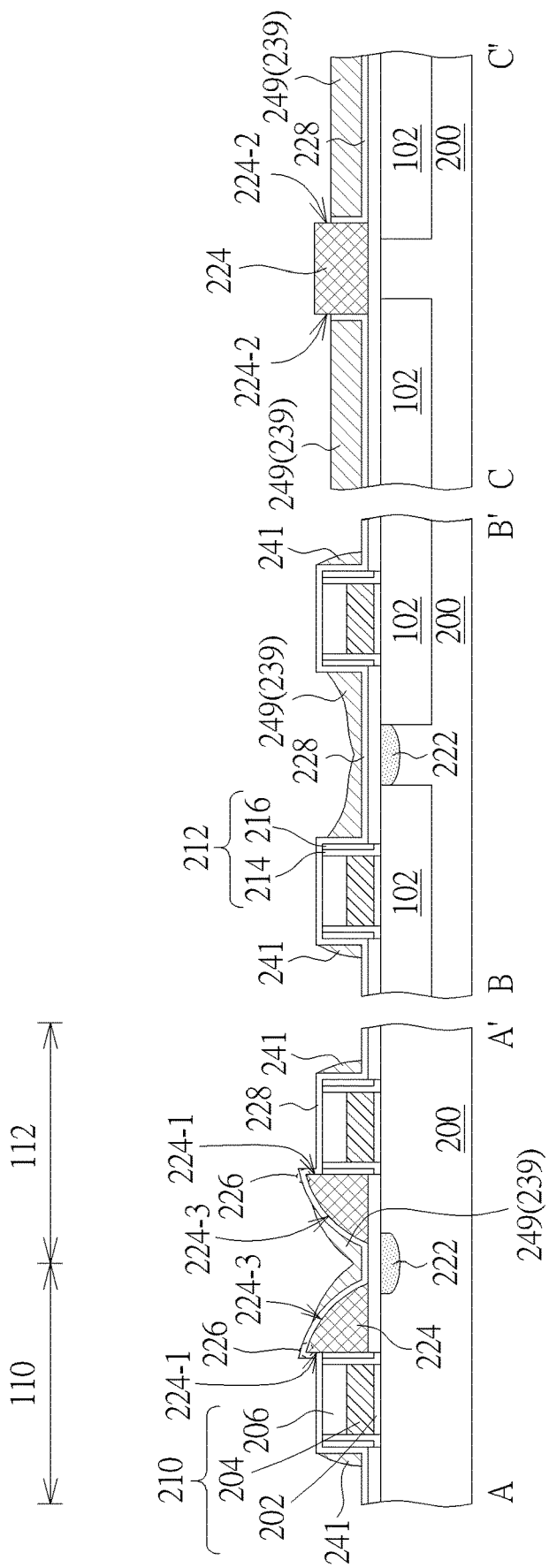
FIG. 10 is a schematic cross-sectional view at a manufacturing stage subsequent to FIG. 6 according to alternative embodiments of the present disclosure, where two adjacent control gates are merged together.

FIG. 10 is a schematic cross-sectional view at a manufacturing stage subsequent to FIG. 6 according to alternative embodiments of the present disclosure, where two adjacent control gates are merged together. Referring to view AA' of FIG. 10, the structure shown in FIG. 10 is analogous to the structure shown in FIG. 7, the main difference is that the control gate 239 at the boundary of the first memory cell region 110 and the second memory cell region 112 is merged together to form an merged control gate 249. Referring to view BB' of FIG. 10, the merged control gate 249 can be disposed directly over the source region 222. Referring to view CC' of FIG. 10, the merged control gate 249 can extend across the underlying isolation structure 102.

Figure 11:
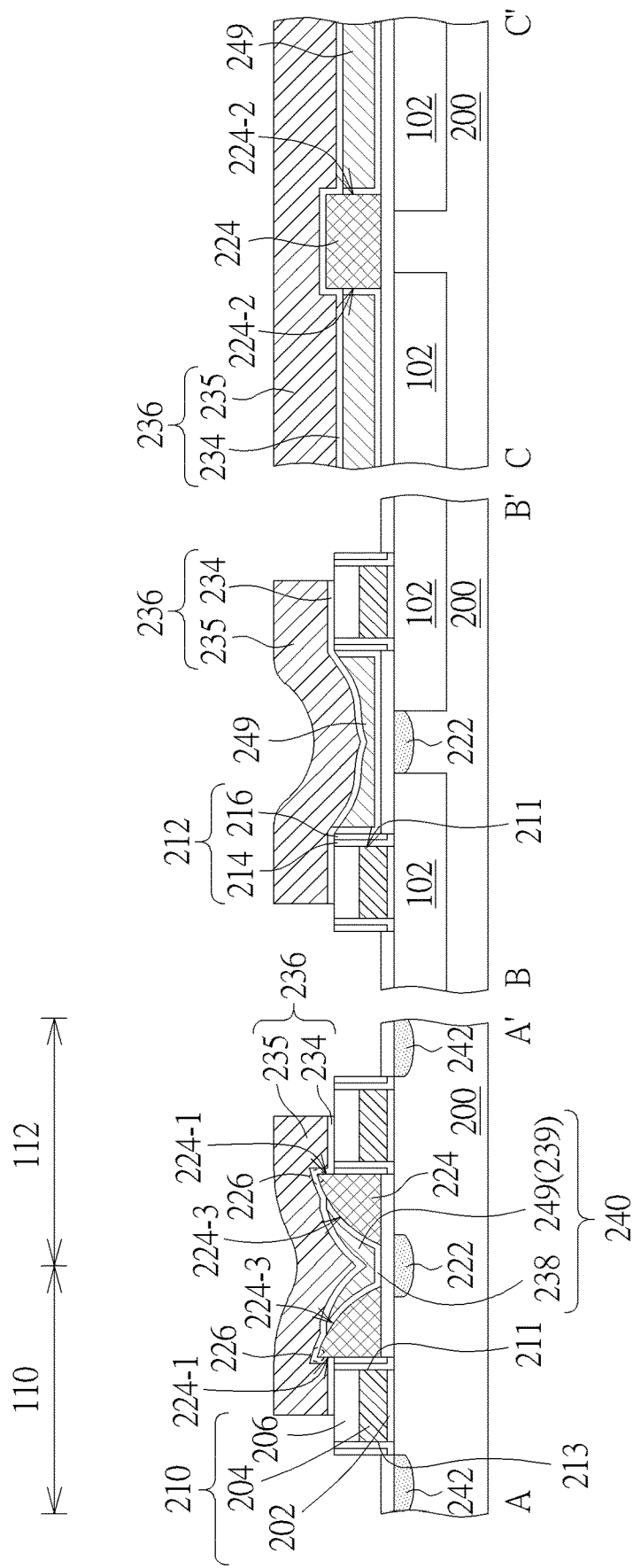
FIG. 11 is a schematic cross-sectional view of a non-volatile memory device corresponding to line A-A', line B-B' and line C-C' of FIG. 9 according to alternative embodiments of the present disclosure, where an erase gate covers a floating gate and a merged control gate.

FIG. 11 is a schematic cross-sectional view of a non-volatile memory device corresponding to line A-A', line B-B' and line C-C' of FIG. 9 according to alternative embodiments of the present disclosure, where an erase gate covers a floating gate and a merged control gate. Referring to views AA' and BB' of FIG. 11, the structure shown in FIG. 11 is analogous to the structure shown in FIG. 8, the main difference is that the merged control gate 249 is disposed between the source region 222 and the erase gate structure 236, and the merged control gate 249 and the coupling dielectric layer 238 can constitute the control gate structure 240 of the non-volatile memory device. By merging two adjacent control gates 239, the merged control gate 249 with an increased width can be obtained. Thus, the electrical resistance of the merged control gate 249 can be reduced, and the memory cells in the memory cell regions 110, 112 can be programmed more efficiently during a programming operation of the non-volatile memory device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A non-volatile memory device, comprising at least one memory cell, wherein the at least one memory cell comprises:
a substrate;
a stacked structure, disposed on the substrate and comprising a gate dielectric layer, an assist gate, and an insulation layer stacked in order;
a tunneling dielectric layer, disposed on the substrate at one side of the stacked structure;

a floating gate, disposed on the tunneling dielectric layer and comprising an uppermost edge and a curved sidewall;

a control gate structure, covering the curved sidewall of the floating gate; and an erase gate structure, covering the floating gate and the control gate structure, wherein the uppermost edge of the floating gate is embedded in the erase gate structure, and a portion of the erase gate structure is disposed above the floating gate and the control gate structure.

2. The non-volatile memory device of claim 1, wherein the floating gate further comprises two lateral sidewalls respectively connected to two edges of the curved sidewall, and the control gate structure are further disposed on the lateral sidewalls between the erase gate structure and the substrate.

3. The non-volatile memory device of claim 1, wherein the floating gate further comprises an inner sidewall facing the stacked structure, wherein the erase gate structure covers the inner sidewall of the floating gate.

4. The non-volatile memory device of claim 1, wherein the uppermost edge of the floating gate is higher than a top surface of the insulation layer.

5. The non-volatile memory device of claim 1, wherein the control gate structure comprises an uppermost edge lower than the uppermost edge of the floating gate.

6. The non-volatile memory device of claim 1, wherein the control gate structure comprises a coupling dielectric and a control gate stacked in sequence, and the coupling dielectric is spaced apart from the uppermost edge of the floating gate.

7. The non-volatile memory device of claim 6, wherein the control gate comprises a curved sidewall.

8. The non-volatile memory device of claim 7, wherein the curved sidewall of the control gate is covered with the erase gate structure completely.

9. The non-volatile memory device of claim 1, wherein a width of the erase gate structure is larger than a width of bottom surface of the floating gate.

10. The non-volatile memory device of claim 1, wherein the erase gate structure further covers a portion of the assist gate.

11. The non-volatile memory device of claim 1, wherein lowermost surface of the erase gate structure is lower than a top surface of the assist gate.

12. The non-volatile memory device of claim 1, wherein the at least one memory cell comprises a first memory cell and a second memory cell, and each of the first and second memory cells comprises the stacked structure, the floating gate, and the control gate structure, wherein the erase gate structure covers the control gate structures of the first and second memory cells.

13. The non-volatile memory device of claim 12, wherein the first memory cell and the second memory cell have a mirror image of each other.

14. The non-volatile memory device of claim 12, wherein the erase gate structure fills up a gap between the floating gates of the first and second memory cells.

15. The non-volatile memory device of claim 12, wherein the non-volatile memory device further comprises a source region shared by the first memory cell and the second memory cell, and the source region is covered with the erase gate structure.

16. The non-volatile memory device of claim 12, wherein the control gate structure of the first memory cell is merged with the control gate structure of the second memory cell.

17. The non-volatile memory device of claim 1, further comprising an isolation structure disposed in the substrate, wherein the control gate structure further comprises a portion disposed on the isolation structure, and the erase gate structure further comprises a portion disposed on the isolation structure, wherein the portion of the control gate structure is disposed between the isolation structure and the portion of the erase gate structure.

18. The non-volatile memory device of claim 17, wherein the assist gate further comprises a portion disposed on the isolation structure, and a sidewall of the portion of the assist gate is covered with the portion of the erase gate structure disposed on the isolation structure.

19. The non-volatile memory device of claim 1, wherein the at least one memory cell comprises a first memory cell and a third memory cell, and the first and third memory cells share the stacked structure, the control gate structure, and the erase gate structure.

20. The non-volatile memory device of claim 19, wherein the control gate structure is a continuous structure extending between the first memory cell and the third memory cell.

* * * * *